(12) United States Patent
Shigyo et al.

(10) Patent No.: US 7,936,566 B2
(45) Date of Patent: May 3, 2011

(54) ELECTRONIC CONTROL UNIT AND WATERPROOF CASE

(75) Inventors: Toshikazu Shigyo, Hitachinaka (JP); Kazunori Nozawa, Tokai (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/594,169

(22) Filed: Nov. 8, 2006

(65) Prior Publication Data

US 2007/0109730 A1 May 17, 2007

(30) Foreign Application Priority Data

Nov. 15, 2005 (JP) ................... 2005-330531

(51) Int. Cl.
*H05K 5/00* (2006.01)

(52) U.S. Cl. .............. 361/752; 361/679; 361/748; 96/4; 137/14; 137/810; 55/282; 55/385.7; 55/467.1; 55/498

(58) Field of Classification Search .................. 361/679, 361/748, 752; 96/4; 700/19, 20, 83; 55/282, 55/385.7, 467.1, 498; 137/14, 810
See application file for complete search history.

(56) References Cited

U.S. PATENT DOCUMENTS

| | | | | |
|---|---|---|---|---|
| 5,050,764 A | * | 9/1991 | Voss | 220/378 |
| 5,961,305 A | * | 10/1999 | Eek et al. | 417/566 |
| 6,445,203 B1 | * | 9/2002 | Yamashita et al. | 324/760 |
| 7,060,227 B2 | * | 6/2006 | Staats | 422/100 |
| 7,357,151 B2 | * | 4/2008 | Lonnes | 137/509 |
| 2002/0029549 A1 | * | 3/2002 | Baumann et al. | 55/385.3 |
| 2006/0054019 A1 | * | 3/2006 | Waida | 96/4 |
| 2006/0089732 A1 | * | 4/2006 | Range | 700/83 |
| 2006/0256510 A1 | * | 11/2006 | Nakasono et al. | 361/679 |
| 2006/0278171 A1 | * | 12/2006 | Conger et al. | 119/419 |

FOREIGN PATENT DOCUMENTS

| | | | | |
|---|---|---|---|---|
| JP | 08104191 A | * | 4/1996 | |
| JP | 10037940 A | * | 2/1998 | |
| JP | 2002-134939 | | 5/2002 | |
| JP | 2005-129861 | | 5/2005 | |
| JP | 2005129861 A | * | 5/2005 | |
| JP | 2005-150376 | | 6/2005 | |
| JP | 2005150376 A | * | 6/2005 | |
| JP | 2005216045 A | * | 8/2005 | |

* cited by examiner

*Primary Examiner* — Xiaoliang Chen

(74) *Attorney, Agent, or Firm* — Crowell & Moring LLP

(57) ABSTRACT

An electronic control unit has a respiratory filter mounted on a waterproof case. Raised protective walls formed in the case surround the portion of the case at which the respiratory filter is arranged. At least two concave portions are provided for drainage that each extend through different positions of the protective walls.

10 Claims, 6 Drawing Sheets

(a)

(b)

(c)

ELECTRONIC CONTROL UNIT AND WATERPROOF CASE

BACKGROUND OF THE INVENTION

1. Field of the Invention

The present invention relates to an electronic control unit and a waterproof case. In particular, it relates to an electronic control unit and a waterproof case, the electronic control unit having a printed-circuit board housed in the waterproof case provided with a respiratory filter.

2. Background Art

As a vehicle-mounted electronic control unit mounted at a site that can be splashed with water in an engine room or the like, an electronic control unit having a printed-circuit board housed in a waterproof case to which a respiratory filter for allowing air to flow into and out of the waterproof case is attached is known (Patent Documents 1 and 2, for example).

In order to prevent a pressure jet from coming into direct contact with the respiratory filter during high-pressure cleaning of an engine room or the like, in one known example, a device is provided with a waterproof case in which a concave portion is formed. By disposing the respiratory filter in the concave portion, the portion at which the respiratory filter is arranged is surrounded by the inner wall of the concave portion, and a drainage channel extending from the concave portion to a side surface of the waterproof case is provided (Patent Document 3, for example).

Patent Document 1: JP Unexamined Patent Publication No. 2005-150376 A

Patent Document 2: JP Unexamined Patent Publication No. 2005-129861 A

Patent Document 3: JP Unexamined Patent Publication No. 2002-134939 A

SUMMARY OF THE INVENTION

Since such drainage channel is disposed only in one direction extending from the concave portion to the side surface of the waterproof case in the conventional electronic control unit, in order for the drainage channel to effectively function in the light of its vertical position or the like, the mounting direction, posture, or location of the electronic control unit in an engine room or the like is restricted. Further, providing such channel portion for drainage raises a possibility that a jet used during high-pressure cleaning would come into direct contact with the respiratory filter, thereby resulting in failure to reliably protect the respiratory filter during high-pressure cleaning or the like.

The present invention has been made in view of the above problems, and it is an object of the present invention to provide an electronic control unit having a respiratory filter in a waterproof case. In the electronic control unit, the respiratory filter can be reliably protected during high-pressure cleaning or the like without restricting the mounting direction, posture, or location of such electronic control unit when it is attached in an engine room or the like.

In order to achieve the above object, in the electronic control unit according to the present invention, a printed-circuit board on which electronic components are mounted is housed in a waterproof case, and the waterproof case is provided with a respiratory filter for allowing air to flow into and out of the waterproof case. The electronic control unit has raised protective walls that surround the portion at which the respiratory filter is arranged, and the waterproof case is provided with at least two concave portions for drainage that each extend through different locations on the protective walls.

In the electronic control unit according to the present invention, preferably, the respiratory filter is fixed in an airtight manner via an O-ring within a ventilation hole formed so that the hole penetrates through the waterproof case, and the height position of the upper edges of the protective walls is higher than the height position of the upper side of the O-ring.

In the electronic control unit according to the present invention, preferably, the concave portions extend in the form of channels from open ends that extend through the protective walls leading to the outside of the case diagonally or radially with respect to the portion at which the respiratory filter is arranged.

In the electronic control unit according to the present invention, preferably, the lateral shape of each of the open ends of the concave portions on the protective walls and the lateral shape of each of the extension ends leading to the outside of the case are rounded, cornerless, or crank-shaped.

In the electronic control unit according to the present invention, preferably, the planar shape of each of the concave portions is a doglegged shape or a labyrinthine shape that is bent more than the doglegged shape.

In the electronic control unit according to the present invention, preferably, the bottom portions of the concave portions are provided with inclined portions having triangle shapes.

In the electronic control unit according to the present invention, preferably, the protective walls are vertical walls that form side surfaces of protruding portions formed so that the protruding portions protrude from outside walls of the waterproof case, and the concave portions extend across the protruding portions so that the concave portions extend through the protective walls at one end and extend through outer walls of the protruding portions at the other end.

In the electronic control unit according to the present invention, preferably, the waterproof case has a consistent wall thickness (board thickness), including the protruding portions.

Further, in order to achieve the above object, the waterproof case according to the present invention is a waterproof case in which a printed-circuit board and the like are housed and is provided with a respiratory filter for allowing air to flow into and out of the waterproof case. The waterproof case has raised protective walls that surround the portion at which the respiratory filter is arranged and that are provided with at least two concave portions for drainage that each extend through different locations of the protective walls.

Since the electronic control unit of the present invention includes such concave portions for drainage or for stagnation prevention positioned in a diagonal or radial manner, corrosion of a waterproof filter or an O-ring due to water or foreign matter is suppressed and the mounting direction, posture, or location in an engine room is not restricted, thereby advantageously offering greater flexibility when mounting the electronic control unit.

Further, since crooked portions, labyrinthine portions, or inclined portions are provided within the concave portions extending from the respiratory filter side to side surfaces of the case, there is an advantage that a jet used during high-pressure cleaning or the like is prevented from coming into direct contact with the respiratory filter.

DESCRIPTION OF PREFERRED EMBODIMENTS OF THE INVENTION

Figure 1:
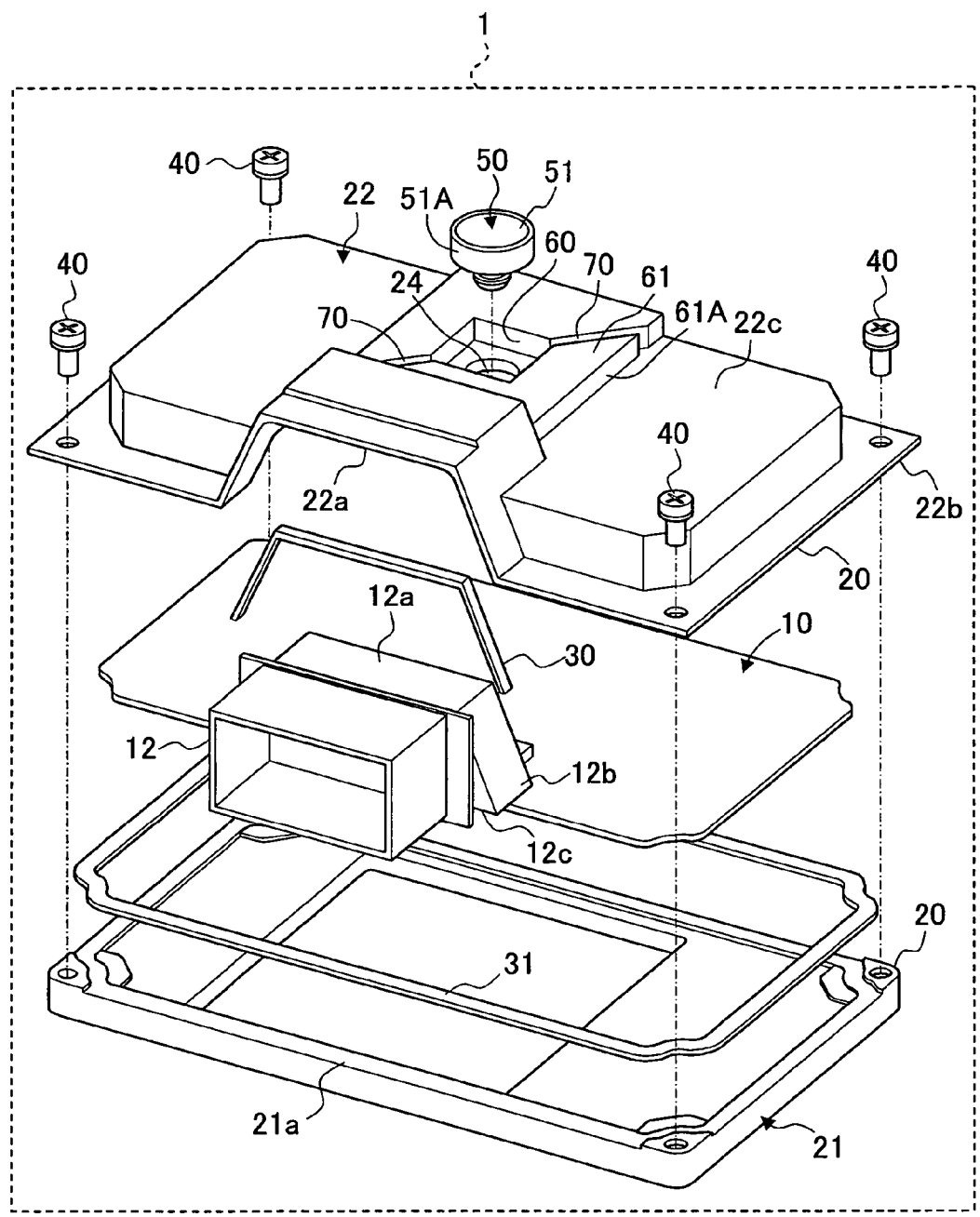
FIG. 1 shows a perspective view of an embodiment of the electronic control unit and waterproof case according to the present invention.
Figure 2:
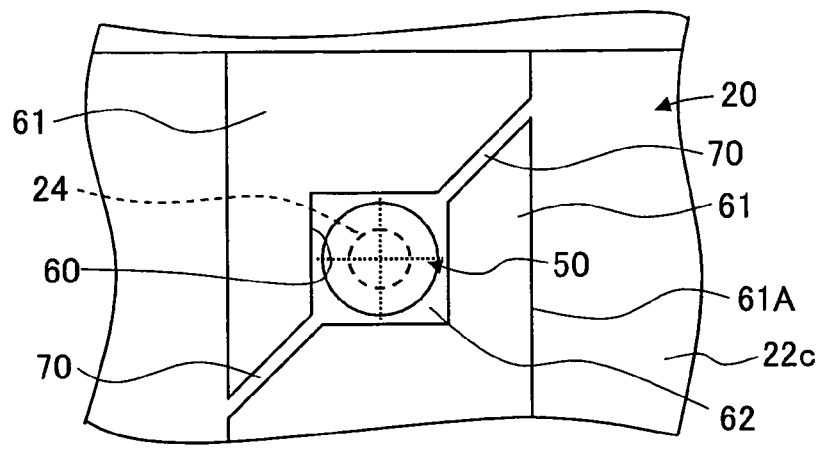
FIG. 2 shows a plan view of a main part of the electronic control unit and waterproof case according to the embodiment.

While preferred embodiments for realizing an electronic control unit of the present invention will be hereafter described in detail, the present invention is not limited to the following embodiments.

An embodiment of an electronic control unit and waterproof case according to the present invention will be described with reference to FIG. 1 to FIG. 4.

An electronic control unit 1 of the present embodiment includes a printed-circuit board 10 on which electronic components (not shown), a connector 12, and the like are mounted, and a waterproof case 20 in which the printed-circuit board 10 is housed.

The waterproof case 20 includes a case body 21 made by die-casting and a cover 22 that is made by die-casting or that is a press-molded article for sealing an opening of the case body 21. The cover 22 has a connector-setting opening 22a having a shape similar to the shape of the connector 12 for receiving the connector 12 mounted on the front end portion of the printed-circuit board 10.

The printed-circuit board 10 is housed between the case body 21 and the cover 22, and the connector 12 is set in the connector-setting opening 22a. A waterproof sealing material (packing) 31 in the form of a frame is sandwiched between the opening-side marginal part 21a of the case body 21 and a peripheral edge 22b of the cover 22 together with a bottom surface portion 12c of the connector 12. A waterproof sealing material 30 is sandwiched between the connector-setting opening 22a of the cover 22 and an upper surface portion 12a together with a side surface portion 12b of the connector 12. They are fastened to each other with a plurality of fastening screws 40.

Power supply to the printed-circuit board 10 and signal input/output between the printed-circuit board 10 and the outside are carried out via the connector 12 disposed in the connector-setting opening 22a and exposed to the outside of the waterproof case 20.

A ventilation hole 24 is formed in an upper surface 22c of the cover 22, such that the hole is communicated with an internal space 23 of the waterproof case 20 in which the printed-circuit board 10 is housed. A cap-type respiratory filter 50 is provided in the ventilation hole 24. The respiratory filter 50 allows air to flow into and out of the waterproof case 20; that is, it adjusts internal pressure of the internal space 23 of the waterproof case 20.

Figure 3:
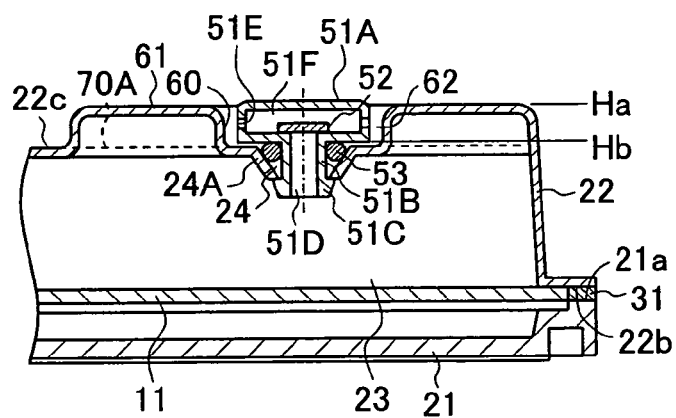
FIG. 3 shows an enlarged vertical section of the main part of the electronic control unit and waterproof case according to the embodiment.
Figure 4:
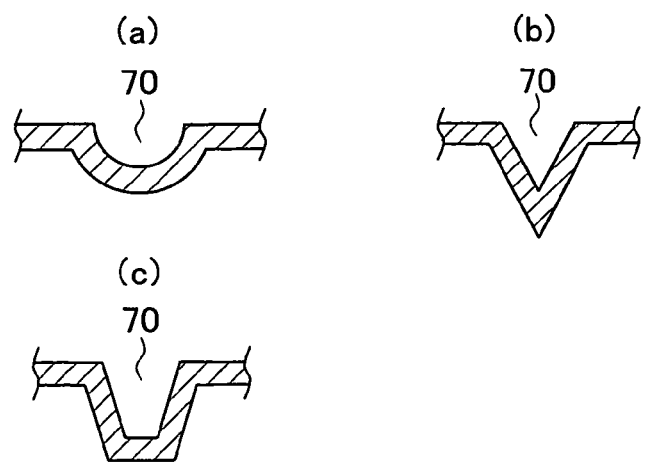
FIGS. 4(a) to (c) show enlarged sectional views of examples of a cross-sectional shape of a concave portion in a filter protection structure portion of the electronic control unit and waterproof case according to the embodiment.

As shown in FIG. 3, the respiratory filter 50 includes a plastic cap member 51 and a filter film 52 provided on the bottom side of a head portion 51A of the cap member 51. The respiratory filter 50 is mounted in a non-returnable manner in the cover 22 with a checking claw 51c formed at the end of a hollow leg body 51B that is integrated with the cap member 51, in a snap-fit manner with an O-ring 53 sandwiched between the cover 22 and the respiratory filter 50.

The filter film 52 prevents the flow of liquid such as water, and it is composed of water-shedding functional fiber material that allows gas flow alone.

The O-ring 53 is made of rubber-like elastic material and is sandwiched between the outer periphery surface of the hollow leg body 51B and the inner periphery surface of a tapered opening portion 24A of the air hole 24 in a state in which it is elastically deformed as required, so as to achieve airtight sealing of this portion.

With this structure, respiration (ventilation) for adjusting internal pressure of the internal space 23 using the respiratory filter 50 takes place only through the ventilation passage formed by a hollow portion 51D of the hollow leg body 51B, the filter film 52, an interior space 51F of the head portion 51A, and a communication opening 51E located in a side surface of the head portion 51A.

The portion at which the respiratory filter 50 is arranged is surrounded by raised protective walls 60.

The protective walls 60 are mainly used for preventing a pressure jet used during high-pressure cleaning or the like from coming into direct contact with the O-ring 53. For this purpose, the height position Ha of the upper edges of the protective walls 60 is set to be higher than the upper height position Hb of the O-ring 53, while the height position Ha may be higher or lower than the height position of the upper surface of the head portion 51A of the respiratory filter 50 in a normal installation state as shown in FIG. 3.

The protective walls 60 are vertical walls, which are inner surfaces of protruding portions 61 formed on the upper surface 22c of the cover 22. As shown in FIG. 3, the wall thickness (board thickness) of the cover 22 is set to be consistent, including the protruding portions 61 by which the protective walls 60 are formed. Thus, compared with cases in which the protruding portions 61 are solid, when the cover 22 is made by die-casting, castability is improved in a shell mold, thereby reducing the amount of material. Further, since the wall thickness (board thickness) is consistent, the cover 22 can be formed as a simple press-molded article.

Drainage concave portions (drainage channels) 70 extend through the protective walls 60. The concave portions 70 are used for preventing water or foreign matter from stagnating in a space 62 between the protective walls 60 and the respiratory filter 50, and the concave portions 70 extend from inner vertical walls (protective walls 60) to outer walls 61A of the protruding portions 61.

The concave portions 70 are provided diagonally with respect to the space 62, the planar shape of which is quadrilateral. Namely, the concave portions 70 extend in the form of channels from open ends that extend through the protective walls 60 leading to the outside of the case diagonally or radially with respect to the portion at which the respiratory filter 50 is arranged. In the present embodiment, the concave portions 70 extend across the protruding portions 61, extend through the protective walls 60 at one end, and extend through the outer walls 61A of the protruding portions 61 at the other end.

In this way, the concave portions 70 extend through two different positions on the protective walls 60, and thus, the single space 62 is provided with two concave portions 70.

Because two concave portions 70 are positioned diagonally with respect to the space 62 in this way, at least one of the concave portions 70 effectively functions as an exhaust path for transmitting water or the like in the space 62 to the outside, irrespective of the direction, posture, or location of the electronic control unit when attached to a vehicle.

Thus, since drainage and anti-stagnation properties for water or foreign matter are assured without restricting the direction, posture, or location of the electronic control unit when attached to a vehicle, a filter protection structure that prevents corrosion of the hollow leg body 51B of the respiratory filter 50 or corrosion of the O-ring 53 is obtained, thereby improving waterproofing and reliability.

The cross-sectional shape of each of the concave portions 70 may be any shape, such as a semicircle (U shape), a V shape, or a vertically inverted trapezoid, as shown in FIGS. 4(a) to 4(c). Further, bottom surfaces 70A (see FIG. 3) of the concave portions 70 may be smoothly joined to the upper surfaces 22c of the cover 22 without differing levels, such that they have the same height position as that of the upper surfaces 22c of the cover 22.

Figure 5:
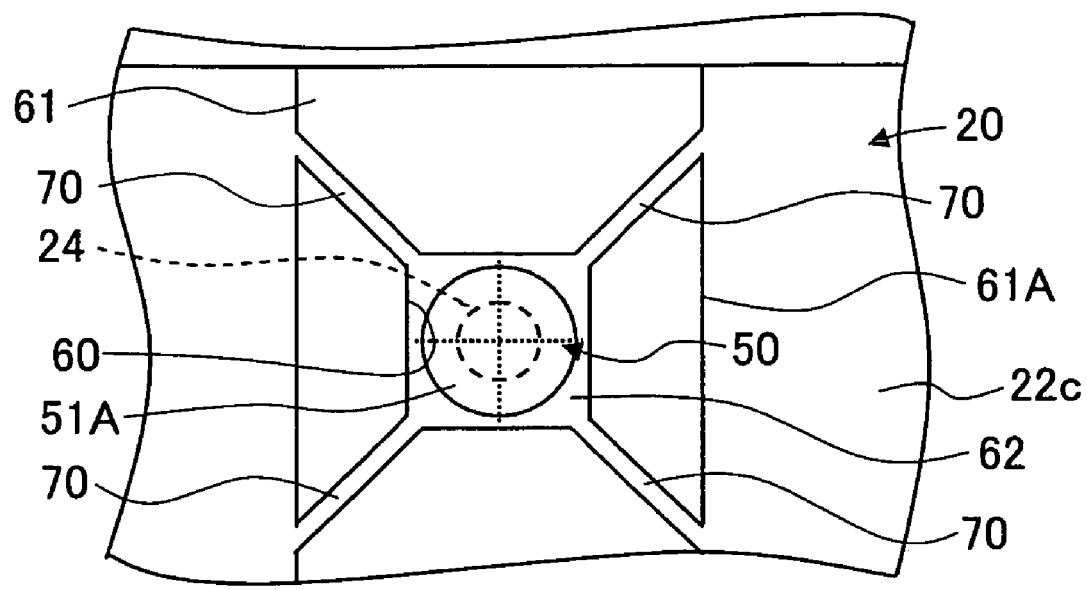
FIG. 5 shows a plan view of the main part of another embodiment of the electronic control unit and waterproof case according to the present invention.

Furthermore, the number of the concave portions 70 is not limited to two. As shown in FIG. 5, a total of four concave portions may be provided along two diagonal lines of the space 62 that are perpendicular to each other (radially), so that the drainage and anti-stagnation properties for water or foreign matter are further assured without restricting the direction, posture, or location of the electronic control unit when attached to a vehicle.

The planar shape of the space 62 is not limited to a quadrilateral shape (polygon), and it may be circular.

Figure 6:
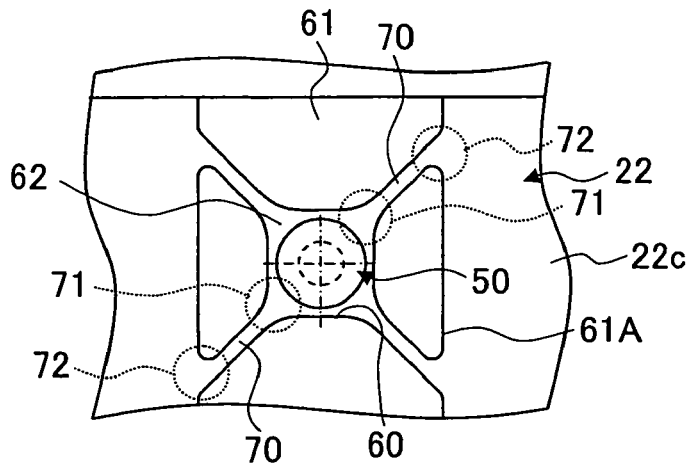
FIGS. 6(a) to (c) show plan views of variations of the electronic control unit and waterproof case according to another embodiment of the present invention.
Figure 6:
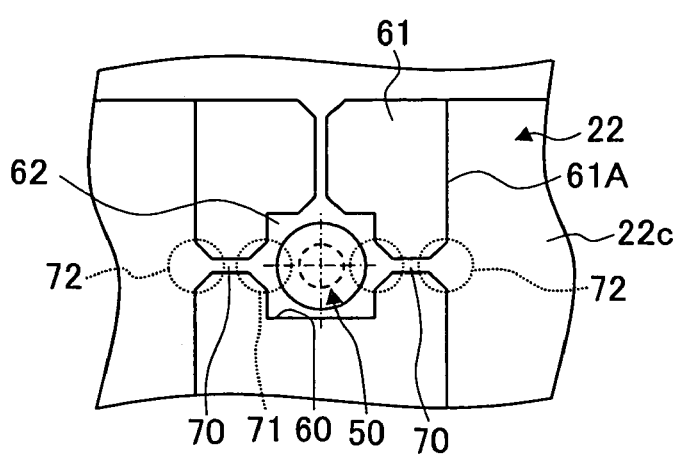
Figure 6:
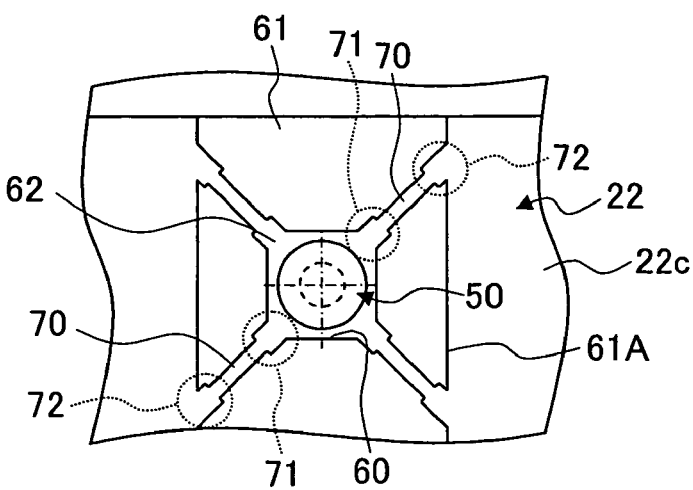

Further, as shown in FIGS. 6(a) to (c), the lateral shape (width shape) of each of the concave portions 70 may be rounded, cornerless, multi-width shaped (crank-shaped), or may exhibit a combination of these width shapes at extension ends; that is, at each open end portion 72 on the sides of the outer walls 61A and each open end portion 71 on the sides of the protective walls 60.

Due to such width shape, drainage or removal of water or foreign matter is smoothly and easily performed through the concave portions 70.

Figure 7:
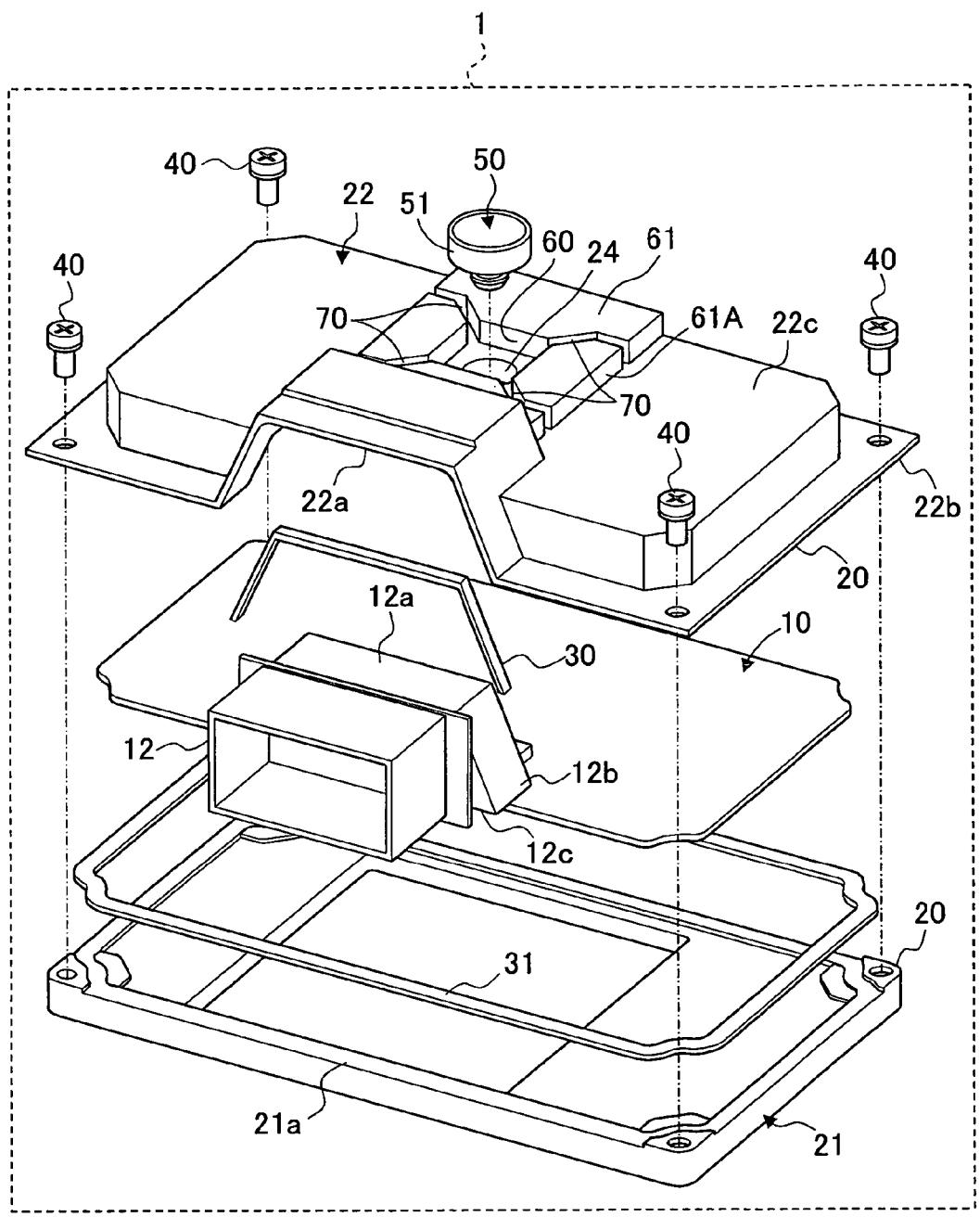
FIG. 7 shows a perspective view of another embodiment of the electronic control unit and waterproof case according to the present invention.
Figure 8:
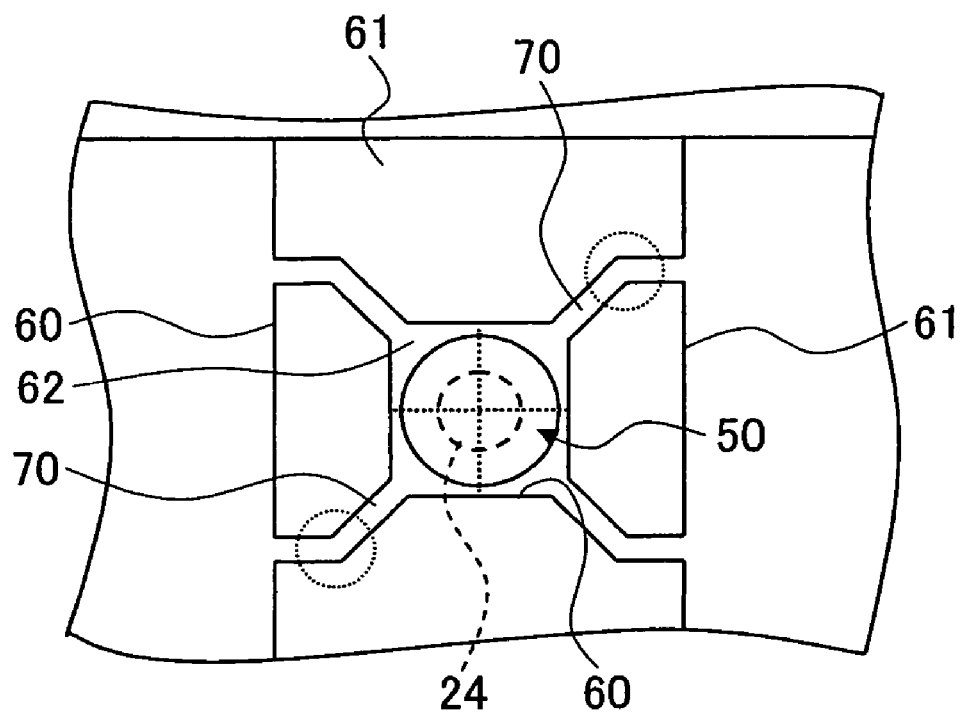
FIG. 8 shows a plan view of the main part of the electronic control unit and waterproof case according to another embodiment of the present invention.

As shown in FIG. 7 and FIG. 8, the planar shape of each of the concave portions 70 may be a doglegged shape or a labyrinthine shape that is bent more than the doglegged shape.

Since the concave portions 70 have doglegged shapes or labyrinthine shapes that are bent more than the doglegged shape, a jet or the like used during high-pressure cleaning is prevented from coming into direct contact with the respiratory filter 50 or the O-ring 53 through the concave portions 70.

Thus, a reliable filter protection structure is obtained, thereby improving waterproofing and reliability.

Figure 9:
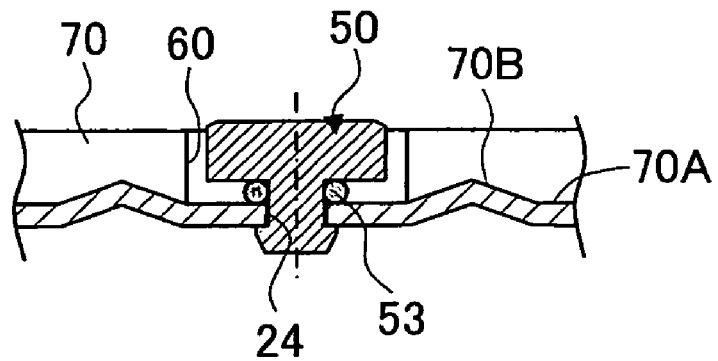
FIG. 9 shows a vertical section of another embodiment of the main part of the electronic control unit and waterproof case according to the present invention.

Further, as shown in FIG. 9, inclined portions 70B having triangle shapes may be provided on the bottom surfaces 70A of the concave portions 70. With this shape for each of the bottom portions, it is also possible to prevent a jet or the like used during high-pressure cleaning from coming into direct contact with the respiratory filter 50 or the O-ring 53 through the concave portions 70.

While the inclination angles of the inclined portions 70B may be arbitrary, it is desirable that the top portions of the inclined portions 70B exceed the height of the O-ring 53.

What is claimed is:

1. An electronic control unit comprising:
a waterproof case;
a printed-circuit board housed in said waterproof case, said circuit board having electronic components mounted thereon; and
a respiratory filter arranged on said waterproof case for allowing air to flow into and out of the waterproof case; wherein
the waterproof case includes a cover comprising cover walls that are of a uniform thickness;
said cover walls include a raised portion with a depression formed therein;
said depression is laterally delimited by protective walls that extend upward from a base of said depression, and are formed by a portion of the cover walls in the raised portion;
said depression has a polygonal shape defined by said protective walls, and surrounds a portion of the case at which the respiratory filter is arranged;
channels extend through said raised portion in a radial direction from each respective corner of the polygonal shape; and
the respiratory filter is fixable in said depression, in an airtight manner via an O-ring, within a ventilation hole formed so that the hole penetrates through the cover, and an upper extent of each of the protective wall is higher than an upper side of the O-ring.

2. The electronic control unit according to claim 1, wherein the channels extend radially with respect to the respiratory filter.

3. The electronic control unit according to claim 1, wherein the channels define open ends that are enlarged, rounded, or both enlarged and rounded.

4. The electronic control unit according to claim 1, wherein each of the channels is doglegged or labyrinthine in configuration.

5. The electronic control unit according to claim 1, wherein bottom portions of the channels are provided with inclined walls.

6. The electronic control unit according to claim 1, wherein:
the protective walls are vertical walls that form side surfaces of the raised portion of the cover walls; and
the channels extend across the raised portion, through the protective walls at one end, and through outer walls of the raised portions at the other end.

7. The electronic control unit according to claim 1, wherein the polygonal shape is rectangular, and the channels consist of four channels, each of which extends outwardly from one corner of the rectangular polygonal shape.

8. An electronic control unit comprising:
a waterproof case comprising a case body and a cover, said cover being defined by exterior walls, which, when mated with said case body, form said water proof case;
a printed circuit board housed within said waterproof case; and
a respiratory filter arranged on said cover for allowing air to flow into and out of the waterproof case; wherein,
said exterior walls of said cover include a raised portion, and have a uniform wall thickness;
a depression is formed in said raised portion of said cover;

said depression is laterally delimited by raised protective walls which are formed by a portion of said exterior walls that define said cover, and extend upward from a base of said depression;

said respiratory filter is mounted within said depression, in an airtight manner via an O-ring, within a ventilation hole that penetrates through the cover;

channels formed in said raised portion extend radially outward from said depression through said raised portion; and an upward extent of each of said protective wall is higher than an upper side of said O-ring.

9. The electronic control unit according to claim 8, wherein:

said depression has a polygonal perimeter with a plurality of corners; and said channels extend radially outward from each respective corner of said polygonal perimeter.

10. An electronic control unit comprising:

a waterproof case that surrounds a printed circuit board;

a depression formed in a wall of said waterproof case, which wall is of a substantially uniform thickness;

a respiratory filter mounted in said depression;

raised protective walls that form a polygonal planar shaped space and surround said respiratory filter, said protective walls being formed by side walls of said depression that extend substantially perpendicularly to said surface of said waterproof case; and drainage channels extending radially from said space through the protective walls, the drainage channels extending outwardly in different directions from respective corners of said polygonal planar shaped space.

\* \* \* \* \*